United States Patent [19]

Hsu

[11] Patent Number: 5,759,896
[45] Date of Patent: Jun. 2, 1998

[54] PROCESS FOR FABRICATING MEMORY CELLS OF FLASH MEMORY

[75] Inventor: Chen-Chung Hsu, Taichung, Taiwan

[73] Assignee: United Microelectronics Corporation, Taiwan

[21] Appl. No.: 669,966

[22] Filed: Jun. 25, 1996

[51] Int. Cl.$^6$ .............................. H01L 21/8247
[52] U.S. Cl. .............................. 438/264; 438/594
[58] Field of Search .................. 438/257, 263, 438/264, 525, 593, 594

[56] References Cited

U.S. PATENT DOCUMENTS 5,482,879  1/1996  Hong ........................... 438/264
5,521,109  5/1996  Hsue et al. .................. 438/263

Primary Examiner—Chandra Chaudhari
Attorney, Agent, or Firm—Rabin, Champagne, & Lynt, P.C.

[57] ABSTRACT

A process for fabricating memory cells of flash memory devices that requires lower voltages between the drain and source regions when storing or erasing data, and avoids the punch-through problem associated with conventional flash memory devices having a high device density. The process includes forming successively on the surface of the silicon substrate a tunnel oxide layer, a floating gate layer, a dielectric layer, and a control gate layer. A portion of the tunnel oxide layer is exposed and unshielded. An ion implantation procedure is then applied to the silicon substrate to form a source region and a drain region. Sidewall spacers are then formed on the sidewalls of the control gate layer, the dielectric layer, the floating gate layer, and an unexposed portion of the tunnel oxide layer. Finally, an impurity is implanted by an inclined ion implantation procedure at incident angle of about 30 to 40 degrees to form a lightly-doped source region in the silicon substrate underneath the unshielded portion of the tunnel oxide layer.

14 Claims, 3 Drawing Sheets

PROCESS FOR FABRICATING MEMORY CELLS OF FLASH MEMORY

BACKGROUND OF THE INVENTION

1. Field of the Invention

The invention relates in general to a process for fabricating flash electrically erasable-programmable read-only memory (Flash EEPROM, or Flash memory), and in particular, to a process for fabricating the memory cells of a flash memory, having lightly-doped source regions.

2. Technical Background

An EEPROM is a semiconductor memory device that is widely used in personal computer systems, as well as in digital electronic equipment. Early stage and conventional memory cells for EEPROM devices utilize floating-gate transistors. EEPROMs have the advantages of being programmable and erasable devices, as well as a capability to retain their memory content even when power is removed. One of the major drawbacks of EEPROMs is their slow read/write speed, typically in the range of 150 to 200 ns. Faster EEPROM devices, with a read/write speed between 70 and 80 ns, have been developed recently. Intel Corporation of Santa Clara, Calif., has referred to this category of memory devices as "flash memory."

FIG. 1 of the accompanying drawings shows a cross-sectional view of a transistor memory cell of a conventional flash memory. As shown in the drawing, the transistor memory cell of a conventional flash memory consists of a floating-gate transistor, which includes a floating-gate layer 10, a control gate layer 12, a tunnel oxide layer 14, a drain region 16, and a source region 18.

A floating-gate transistor operates based on a phenomena known as the Fowler-Nordheim tunneling effect. When data is written to the memory device, a relatively high voltage of approximately 12 volts is applied between the drain region 16 and the source region 18. Another high voltage is also applied to the control gate layer 12. A hot electron flow initiates at the source region 18, passes through the tunnel oxide layer 14 near the drain region 16, and terminates in the floating-gate layer 10, where the electrons are trapped. This increases the threshold voltage of the floating-gate transistor and facilitates the storage of data in the cell. To erase the stored data, a suitable negative voltage is applied to the control gate layer 12 to allow the electrons trapped within the floating-gate layer 10 to tunnel through the tunnel oxide layer 14. This process erases the stored data, and restores the floating-gate transistor to its original state.

Such conventional flash memory as described above has at least the following drawbacks:

a) Due to the fact that source and drain regions are impurity-diffused regions located symmetrically on opposite sides of the floating gate layer, a very high voltage must be applied between the drain and source regions to establish a high intensity tunneling electric field, in order to allow the hot electrons to tunnel through the tunnel oxide layer near the drain region and reach the floating gate layer.

b) The applied high voltage increases the probability of punch-through, and thus prohibits a reduction of the size of the device.

SUMMARY OF THE INVENTION

It is therefore an object of the invention to provide a process for fabricating the memory cells of flash memory semiconductor devices. The memory cells of flash memory fabricated in accordance with the invention have lightly-doped drain regions, and the voltage required to be applied between the drain and source regions when storing data can therefore be reduced.

It is another object of the invention is to provide a process for fabricating memory cells of the flash memory in order to reduce the probability of punch-through when the device size is decreased to achieve a flash memory having increased density.

A process for fabricating the inventive memory cells of flash memory, which is able to achieve the aforementioned and other objects of the invention, includes the following steps: First, a tunnel oxide layer is formed on top of a silicon substrate. Then a first polysilicon layer, a dielectric layer, a second polysilicon layer, and a silicide layer are formed in sequence. Next, a control gate shielding mask, overlapping a portion of the tunnel oxide layer and having an edge aligned with an edge of the tunnel oxide layer, is formed on the surface of the silicide layer. Portions of the silicide layer, the second polysilicon layer, the dielectric layer, and the first polysilicon layer are then removed by etching in the presence of the control gate shielding mask. As a result of such etching, a control gate layer and a floating gate layer are formed, and the unmasked region is exposed above the tunnel oxide layer. Next, an ion implantation procedure is applied to the silicon substrate to provide a source region and a drain region, with the source region being formed adjacent to the unshielded region of the tunnel oxide layer. Oxide sidewall spacers are then formed on the sidewalls of the control gate layer, the remaining dielectric layer, the floating gate layer, and the tunnel oxide layer. Finally, ions are implanted at an incident angle of 30 to 40 degrees to form a lightly-doped source region on the silicon substrate under the unshielded region of the tunnel oxide layer.

BRIEF DESCRIPTION OF THE DRAWINGS

Other objects, features, and advantages of the invention will become apparent by way of the following detailed description of the preferred but non-limiting embodiment. The description is made with reference to the accompanying drawings in which.

DETAILED DESCRIPTION OF THE PREFERRED EMBODIMENT

Figure 1:
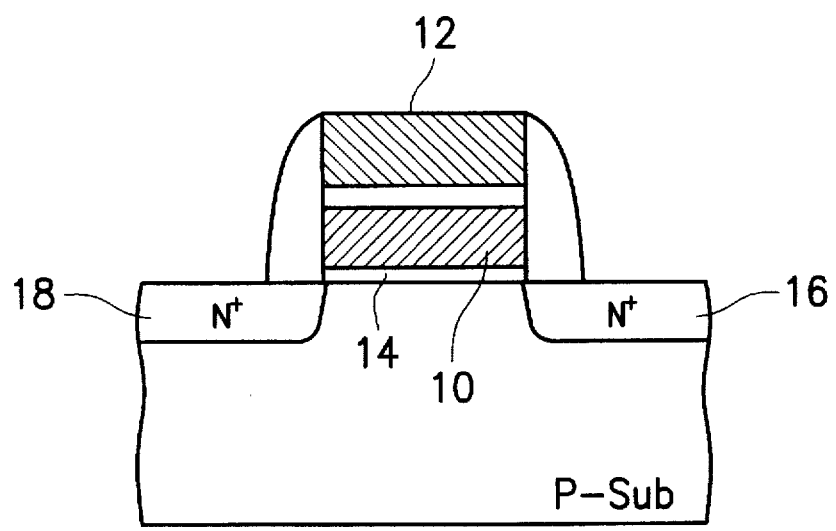
FIG. 1 is a cross-sectional view schematically showing the structural configuration of the memory cell of a conventional flash memory.
Figure 2A:
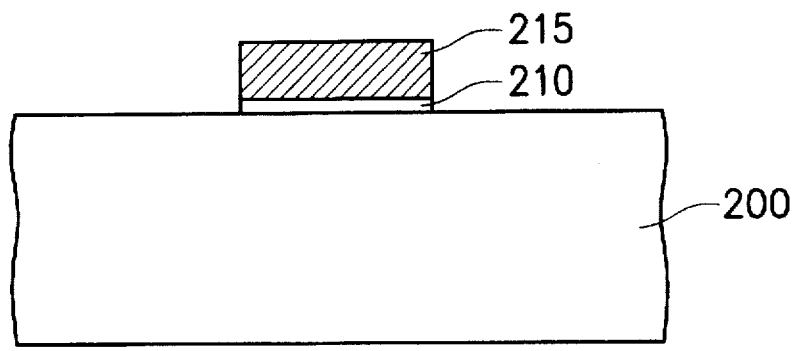
FIGS. 2A to 2E are cross-sectional views of the memory cell of a flash memory at different stages of a fabrication process in accordance with a preferred embodiment of the invention.

Referring to FIGS. 2A to 2E, the cross-sectional views depict the memory cell of a flash memory at different stages of a fabrication process in accordance with a preferred embodiment of the invention. In FIG. 2A, a region designated for the fabrication of a transistor memory cell is first laid out on the silicon substrate 200. A tunnel oxide layer 210 and a first polysilicon layer 215 are then sequentially formed in the designated region. Since hot electrons must be able to tunnel through the tunnel oxide layer 210 when storing or deleting data, the thickness of the tunnel oxide layer cannot be too great. It should be approximately 60 to 120 Å. The first polysilicon layer 215, to be used as the floating gate layer, has a thickness of approximately 800 to 2,000 Å.

The tunnel oxide layer 210 and the first polysilicon layer 215 can be constructed by the following procedural steps.

First an oxide layer 210, and then a polysilicon layer 215, are formed on the silicon substrate 200. This is followed by the performance of an ion implantation procedure over the polysilicon layer 215 to enhance the conductivity thereof. Typically, phosphorus ions are used, and are implanted at an energy of about 20 to 50 KeV, to a dosage of about $10^{14}$–$10^{15}$ atoms/cm$^2$. Next, a tunneling shielding mask is formed covering the designated transistor channel region, and the first polysilicon layer 215 and a tunnel oxide layer 210 are shaped by first etching into the polysilicon layer 215 and then the oxide layer 210, in the presence of the shielding mask.

Figure 2B:
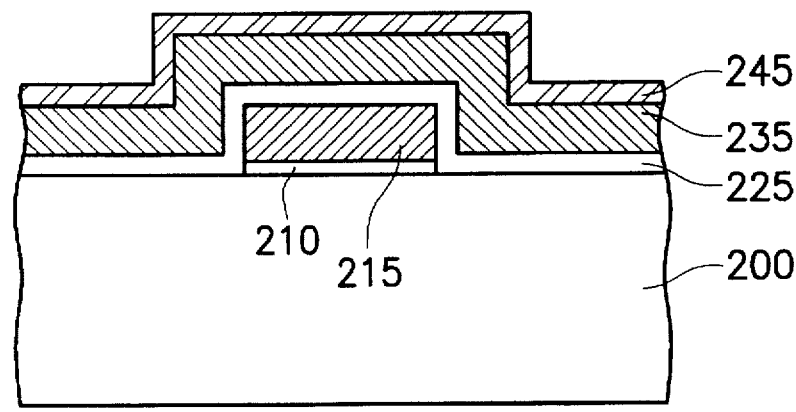

FIG. 2B illustrates the procedural steps to be followed to form a dielectric layer 225, a second polysilicon layer 235, and a silicide layer 245 covering the silicon substrate 200 and the first polysilicon layer 215. First, a dielectric layer 225 is formed. This dielectric layer 225 can be an oxide/nitride/oxide (ONO) layer, with a typical thickness of about 120 to 250 Å. Next, the second polysilicon layer 235 is formed by deposition. The thickness of the second polysilicon layer is approximately 1,000 to 2,000 Å. An ion implantation procedure similar to that applied to the first polysilicon layer 215 is also applied to the second polysilicon layer, utilizing phosphorus ions as the impurity. The phosphorus ions are implanted at an energy of approximately 20 to 50 KeV, to achieve a dosage of about $10^{15}$ to $10^{16}$ atoms/cm$^2$. Finally, a silicide layer 245, having a thickness of approximately 1,500 to 2,000 Å, is deposited. Typically, tungsten silicide is used for the silicide layer 245.

Figure 2C:
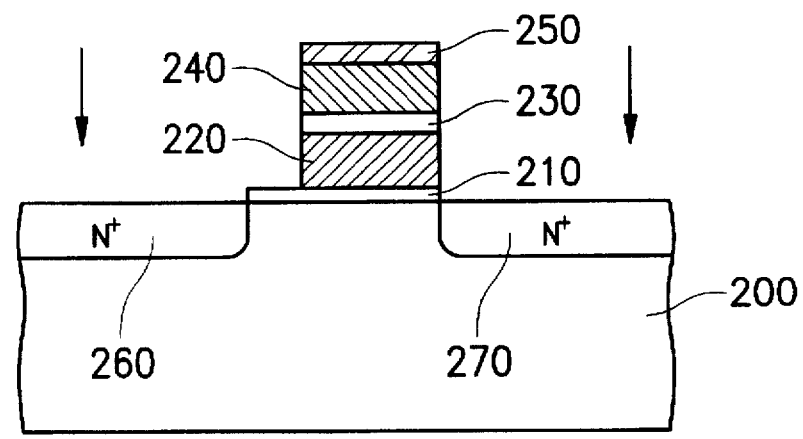

FIG. 2C illustrates the procedure for establishing the source, drain, and gate of the transistor memory cell. First, a control gate shielding mask is formed on the surface of the silicide layer described above. It partially overlaps the tunnel oxide layer 210, with one of its edges aligned with one edge of the tunnel oxide layer 210. A self-aligning etching process is then used to remove the silicide layer, the second polysilicon layer, the dielectric layer and the first polysilicon layer, in the area out of the coverage of the control gate shielding mask, leaving a remaining first polysilicon layer 220, a remaining dielectric layer 230, a remaining second polysilicon layer 240 and a remaining silicide layer 250. The control gate layer includes the combined structure of the remaining silicide layer 250 and the remaining second polysilicon layer 240. The remaining first polysilicon layer 220 may also be referred to as the floating gate layer 220. The control gate layer and the floating gate layer 220 are insulated by the remaining dielectric layer 230 between them.

Since the overlap between the control gate shielding mask and the tunnel oxide layer 210 is only partial, and with only one edge of each aligned, the area above the tunnel oxide not covered by the control gate shielding mask is not covered by the floating gate layer 220. Next, using the tunnel oxide 210 as a shielding mask, an ion implantation process is performed on the silicon substrate 200 to form a source region 260 in the region adjacent to the unshielded tunnel oxide layer 210. A drain region 270 is formed on the opposite side of the tunnel oxide layer 210. In general, arsenic ions are used as the impurity for the ion implantation procedure applied to the silicon substrate, and are implanted at an energy of approximately 30 to 100 KeV, so as to provide a dosage of approximately $10^{15}$ to $10^{16}$ atoms/cm$^2$.

Figure 2D:
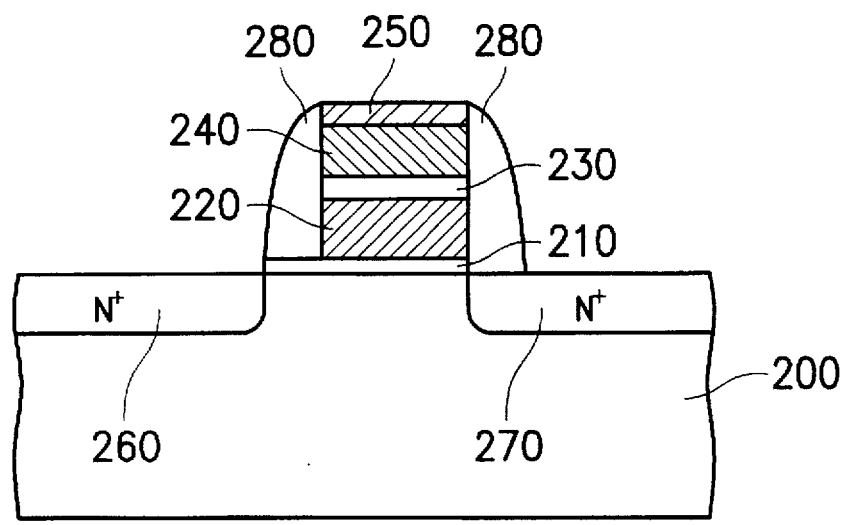

FIG. 2D illustrates the procedure for constructing oxide sidewall spacers 280 on the sidewalls of the control gate layer, dielectric layer 230, floating gate layer 220, and tunneling oxide layer 210. In this process, a thick oxide layer is first deposited over the substrate to a thickness of approximately 0.05 to 0.12 micron. Then, the oxide is removed by etching until the source region 260, the drain region 270, and the silicide layer 250 are exposed.

Figure 2E:
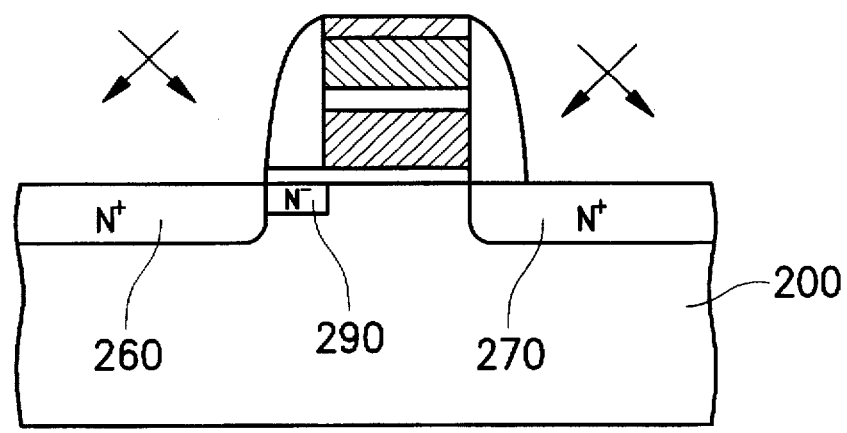

Referring next to FIG. 2E, a final ion implantation procedure is performed by implanting an impurity at an incident angle of 30 to 40 degrees, to form a lightly-doped source region 290 in the silicon substrate 200 underneath the unshielded tunnel oxide layer 210. This completes the process of the fabrication of the transistor memory cell, of the flash memory. The portion of the impurity injected into the drain region 270 does not form a separate region, due to the presence of the high impurity concentration already in place. Typically, the impurity used to form the lightly-doped source region is phosphorus, and is implanted at energy of approximately 30 to 80 KeV. The implantation dosage is typically in the range of $10^{13}$ to $10^{14}$ atoms/cm$^2$.

Since the memory cells of the flash memory fabricated in accordance with the invention include lightly-doped source regions, a high voltage of only about 12 to 15 V applied to the control gate, and a low voltage of about 3.3 to 5 V between the drain and the source, are needed to enable the hot electrons to tunnel through the tunnel oxide layer near the source region, in order to facilitate the storage of data in each memory cell. To erase the stored data, only a −10 V voltage on the control gate, and a 5 V voltage on the source region, are required.

From the above description of the preferred embodiment, it is clear that the flash memory fabricated in accordance with the invention can reduce the voltage requirement for the storage and erasure of data in the memory cells. Further, the flash memory of the invention does not have the drawback of conventional flash memories, of being subject to an increased probability of punch-through as the size of the device is decreased. Therefore, the flash memories fabricated according to the invention can be provided in high-density flash memory devices.

As persons skilled in the art can well appreciate, the above description of the preferred embodiment of the invention is intended to exemplify, but not to limit, the scope of the invention. Modifications to the described embodiment of the invention will be apparent and should be considered to be within the scope of the invention as specified in the appended claims.

What is claimed is:

1. A process for fabricating memory cells of a flash memory device, comprising the steps of:

a. providing a silicon substrate;

b. forming a tunnel oxide layer on the silicon substrate, and then forming a first polysilicon layer on top of the tunnel oxide layer;

c. successively forming a dielectric layer, a second polysilicon layer, and a silicide layer on top of the first polysilicon layer and the tunnel oxide layer;

d. forming a control gate shielding mask on a surface of the silicide layer, so as to partially cover the tunnel oxide layer, with one edge of the mask aligned with one edge of the tunnel oxide layer;

e. performing an etching procedure utilizing the control gate shielding mask, to partially remove the silicide layer, the second polysilicon layer, the dielectric layer and the first polysilicon layer, so as to form a control gate layer and a floating gate layer, and expose an unshielded region on one side of the tunnel oxide layer;

f. implanting first impurities in the silicon substrate by a first ion implantation procedure, to form a source region and a drain region on the silicon substrate, the source region being adjacent to the unshielded region of the tunnel oxide layer;

g. forming oxide sidewall spacers on sidewalls of the control gate layer, a remaining portion of the dielectric layer, the floating gate layer, and the unexposed region of the tunneling gate layer; and h. implanting a second impurity in the substrate by an ion implantation procedure, at an incident angle of about 30 to 40 degrees, to form a lightly-doped source region in the silicon substrate under the unshielded region of the tunnel oxide layer.

2. The process of claim 1, wherein said step b of forming the tunnel oxide layer and the first polysilicon layer further comprises the steps of:

successively forming an oxide layer and a layer of polysilicon on a surface of the silicon substrate;

applying an ion implantation procedure to the layer of polysilicon to increase the conductivity thereof;

forming a tunneling layer shielding mask; and applying an etching procedure to the layer of polysilicon, utilizing the tunneling layer shielding mask, to form the first polysilicon layer, and then applying another etching procedure to the oxide layer to form the tunnel oxide layer.

3. The process of claim 2, wherein the tunnel oxide layer has a thickness of about 60 to 120 Å.

4. The process of claim 2, wherein the first polysilicon layer has a thickness of about 800 to 2,000 Å.

5. The process of claim 2, wherein the first impurities include phosphorus ions, and wherein said step b includes implanting phosphorous ions at an implantation energy of about 20 to 50 KeV, so as to achieve a dosage of about $10^{14}$ to $10^{15}$ atoms/cm$^2$.

6. The process of claim 1, wherein said step c includes:

forming the second polysilicon layer by deposition; and increasing the conductivity of the second polysilicon layer by applying an ion implantation procedure to the second polysilicon layer.

7. The process of claim 6, wherein the second polysilicon layer has a thickness of about 1,000 to 2,000 Å.

8. The process of claim 6, wherein the ion implantation procedure applied to the second polysilicon layer includes implanting phosphorus ions with an implantation energy of about 20 to 50 KeV to achieve a dosage of about $10^{15}$ to $10^{16}$ atoms/cm$^2$.

9. The process of claim 1, wherein the silicide layer is a tungsten silicide layer.

10. The process of claim 9, wherein the silicide layer has a thickness of about 1,500 to 2,000 Å.

11. The process of claim 1, wherein the impurities for the ion implantation procedure of said step f for forming the source and drain regions are arsenic ions, and wherein said step f includes implanting the arsenic ions at an implantation energy of about 30 to 100 KeV so as to achieve a dosage of about $10^{15}$ to $10^{16}$ atoms/cm$^2$.

12. The process of claim 1, wherein said step g of forming sidewall spacers further comprises the steps of:

depositing a thick oxide layer over the substrate; and etching into the thick oxide layer until the source region, the drain region, and the silicide layer are exposed.

13. The process of claim 12, wherein the thick oxide layer has a thickness of about 0.05 to 0.12 micron.

14. The process of claim 1, wherein the impurity for the ion implantation procedure of said step h are phosphorus ions, and are implanted with an implantation energy of about 30 to 80 KeV, so as to achieve a dosage of about $10^{13}$ to $10^{14}$ atoms/cm$^2$.

* * * * *